US009893170B1

(12) United States Patent
Yoo et al.

(10) Patent No.: US 9,893,170 B1
(45) Date of Patent: Feb. 13, 2018

(54) MANUFACTURING METHOD OF SELECTIVELY ETCHED DMOS BODY PICKUP

(71) Applicant: Monolithic Power Systems Inc., San Jose, CA (US)

(72) Inventors: Ji-Hyoung Yoo, Los Gatos, CA (US); Jeesung Jung, San Jose, CA (US); Joel M. McGregor, Issaquah, WA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/356,511

(22) Filed: Nov. 18, 2016

(51) Int. Cl.
*H01L 21/266* (2006.01)
*H01L 29/66* (2006.01)
*H01L 29/10* (2006.01)
*H01L 29/08* (2006.01)
*H01L 29/06* (2006.01)
*H01L 21/28* (2006.01)

(52) U.S. Cl.
CPC ...... *H01L 29/66689* (2013.01); *H01L 21/266* (2013.01); *H01L 21/28035* (2013.01); *H01L 29/0684* (2013.01); *H01L 29/0865* (2013.01); *H01L 29/1095* (2013.01)

(58) Field of Classification Search
CPC ......... H01L 21/26586; H01L 29/66681; H01L 29/1095

USPC .......................................................... 438/302
See application file for complete search history.

(56) References Cited

U.S. PATENT DOCUMENTS

| | | | |
|---|---|---|---|
| 6,252,278 B1 | 6/2001 | Hsing | |
| 6,518,138 B2 | 2/2003 | Hsing | |
| 8,546,879 B2 | 10/2013 | Disney et al. | |
| 9,159,795 B2 | 10/2015 | Yoo et al. | |
| 9,502,251 B1 | 11/2016 | McGregor et al. | |
| 2002/0100951 A1* | 8/2002 | Yasuhara | H01L 29/402 257/491 |
| 2013/0043534 A1* | 2/2013 | Disney | H01L 29/41766 257/336 |

* cited by examiner

*Primary Examiner* — Anthony Ho
*Assistant Examiner* — Antonio Crite
(74) *Attorney, Agent, or Firm* — Perkins Coie LLP

(57) ABSTRACT

A method for fabricating a LDMOS device in a well region of a semiconductor substrate, including: forming a body region and a source layer in the well region through a window of a polysilicon layer above the well region, wherein the body region has a deeper junction depth than the source layer; forming spacers at side walls of the polysilicon layer; and etching through the source layer through a window shaped by the spacers, wherein the source layer under the spacers is protected from etching, and is defined as source regions of the LDMOS device.

15 Claims, 7 Drawing Sheets

MANUFACTURING METHOD OF SELECTIVELY ETCHED DMOS BODY PICKUP

TECHNICAL FIELD

The present invention generally relates to semiconductor devices, and more particularly but not exclusively relates to methods for forming reduced source regions in Laterally Diffused Metal Oxide Semiconductor (LDMOS) devices.

BACKGROUND

LDMOS (Lateral Diffused Metal Oxide Semiconductor) devices are widely used for high breakdown voltage, high current and good thermal performance in many applications including notebook, server, and DC/DC converter.

A LDMOS device comprises a well region 16, a drain pickup region 11, a source region 12, a gate 13, a body region 14, and a body pickup region 15 as shown in FIG. 1. The well region 16 is also referred as the drain drift region. For performance and cost reasons, many modern applications require smaller power devices in a smaller package. Much focus has been placed on drain engineering that includes RESURF (Reduced Surface Field), graded doped drain. Another area of focus is on making source region smaller. As shown in FIG. 1, a source/body region consists of the body pickup region 15 in the center and the source regions 12 located on both sides of the body pickup region 15, which form an N+/P+/N+ region. Reducing the N+/P+/N+ region would result in a smaller source region. But usually the minimum area of the N+/P+/N+ is limited by the photo-masking equipment's capability.

SUMMARY

It is an object of the present invention to provide a process making reduced source region by using spacers to form a self-aligned body region, a source region and a body pickup at one masking step instead of using a photo/masking step, which has certain limit to make smaller source/body window due to the equipment capability. As a result, the present invention achieves reduced source regions of LDMOS device and significant reduction of the cost for making LDMOS device.

The embodiments of the present invention are directed to a manufacturing process of a LDMOS device in a well region of a first doping type in a semiconductor substrate, comprising: forming a gate oxidation layer above the well region; forming a polysilicon layer above the gate oxidation layer; forming a layer of material having faster etching rate than the gate oxidation layer above the polysilicon layer; etching both of the layer of material having faster etching rate than the gate oxidation layer and the polysilicon layer through a window of a first masking layer; implanting dopants of a second doping type into the well region under the window of the first masking layer to form a body region; implanting dopants of the first doping type into the body region under the window of the first masking layer to form a source layer; forming spacers to wrap side walls of the polysilicon layer; etching through the source layer under a window shaped by the spacers to form a source region; implanting dopants of the second doping type into the body region through the window shaped by the spacers to form a body pickup region; etching away both the spacers and the layer of material having faster etching rate than the gate oxidation layer; etching the polysilicon layer through windows of a second masking layer to form a gate; and implanting dopants of the first doping type into the well region under a window of a third masking layer to form a drain pickup region.

The embodiments of the present invention are also directed to a method for fabricating a LDMOS device in a well region of the semiconductor substrate, comprising: forming a body region and a source layer in the well region through a window of a polysilicon layer above the well region, wherein the body region has a deeper junction depth than the source layer; forming spacers at side walls of the polysilicon layer; and etching through the source layer through a window shaped by the spacers, wherein a region of the source layer under the spacers is protected from etching, and is defined as a source region of the LDMOS device.

The embodiments of the present invention are further directed to a manufacturing process of a LDMOS device, comprising: forming a well region in a semiconductor substrate; forming a gate oxidation layer above the well region; depositing a polysilicon layer above the gate oxidation layer; sequentially forming a gate seal layer, a silicon nitride layer and a first masking layer above the polysilicon layer, wherein the first masking layer comprises at least one window to the surface of the silicon nitride layer; etching the silicon nitride layer, the gate seal layer and the polysilicon layer under the window of the first masking layer to expose a window for a body region in the well region; implanting P type dopants into the well region through the window for the body region to form the body region in the well region; implanting N type dopants into the body region through the window for the body region to form a source layer, and removing the first masking layer afterwards; oxidizing side walls of the polysilicon layer; forming spacers at the oxidized side walls of the polysilicon layer; etching through the source layer through a window shaped by the spacers to form a source regions under the spacer; implanting P type dopants into a etched region between the source regions to form a body pickup region; etching away the silicon nitride layer and the spacers; forming a second masking layer above the gate seal layer, wherein the second masking layer has windows at predetermined positions; etching the gate seal layer and the polysilicon layer through the windows of the second masking layer to form a gate, and removing the second masking layer afterwards; forming a third masking layer above the gate seal layer and the gate oxidation layer, wherein the third masking layer comprise at least one window for a drain pickup region; and implanting N type dopants into the well region under the at least one window of the third masking layer to form the drain pickup region, and removing the third masking layer afterwards.

BRIEF DESCRIPTION OF THE DRAWING

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," right," "in," "out," "front," "back," "up," "down, "top," "atop", "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 2:
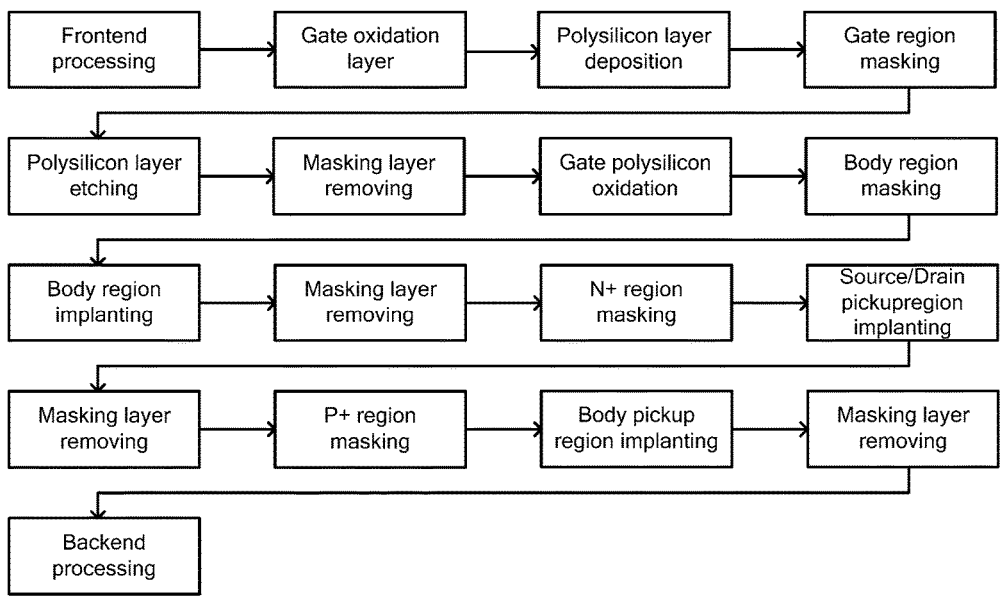
FIG. 2 shows a process flowchart outlining a prior art manufacturing process that could be used to fabricate the LDMOS device.

FIG. 2 shows a process flowchart outlining a prior art manufacturing process that could be used to fabricate a LDMOS device. The prior art manufacturing process may comprise steps of a frontend processing, gate oxidation, polysilicon layer deposition, gate region masking, polysilicon layer etching, masking layer removing, gate polysilicon oxidation, body region masking, body region implanting, masking layer removing, N+ region masking, source/drain region implanting, masking layer removing, P+ region masking, body pickup region implanting, masking layer removing and a backend processing. The frontend processing may comprise preparing an original substrate, forming N type buried layer (NBL), growing epitaxial layer (EPI), and defining active areas. And in some applications, the frontend processing further comprises forming a thick gate oxidation layer. Backend processing may comprise forming electrodes for the source region, the drain pickup region, the body pickup region and the gate, and then distributing metal layer. Persons of ordinary skill in the art should know that a masking step, also referred as photo-masking step, means to form a masking layer with certain openings for defining determined areas on a top surface of a whole semiconductor substrate. For example, step of body region masking comprises forming a masking layer on the top surface of the whole semiconductor substrate, and patterning the masking layer to form openings to define the body regions. The masking layer may comprise a photoresist layer.

Figure 1:
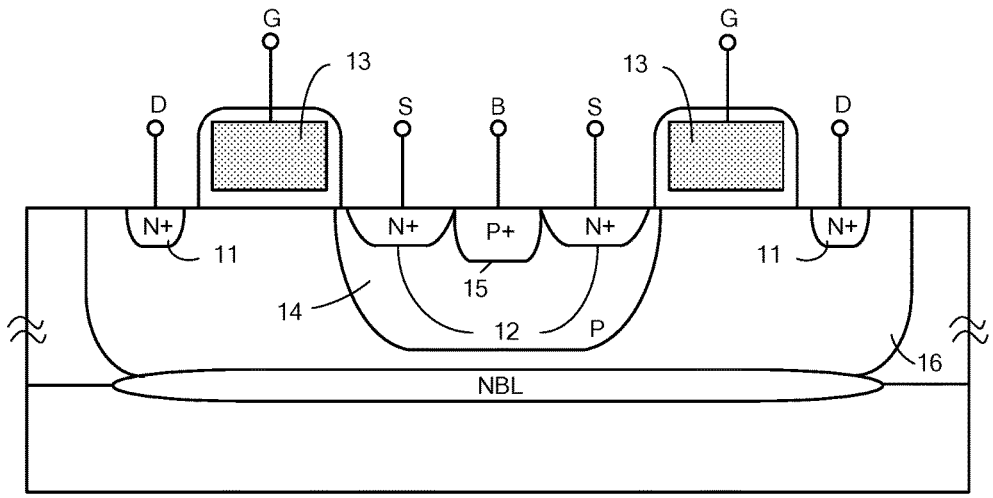
FIG. 1 shows a prior art LDMOS device.

As can be seen from FIG. 2, the body region, the body pickup region, the source region, and the drain pickup region are formed by traditional photo-masking and ion-implantation technique. As a result, the area of an opening for defining the source/body region, i.e., the N+/P+/N+ region in FIG. 1 would apparently be limited by the photo-masking equipment's capability.

FIGS. 3a-i illustrate a process to fabricate a LDMOS device with smaller source in accordance with an embodiment of the present invention.

Figure 3A:
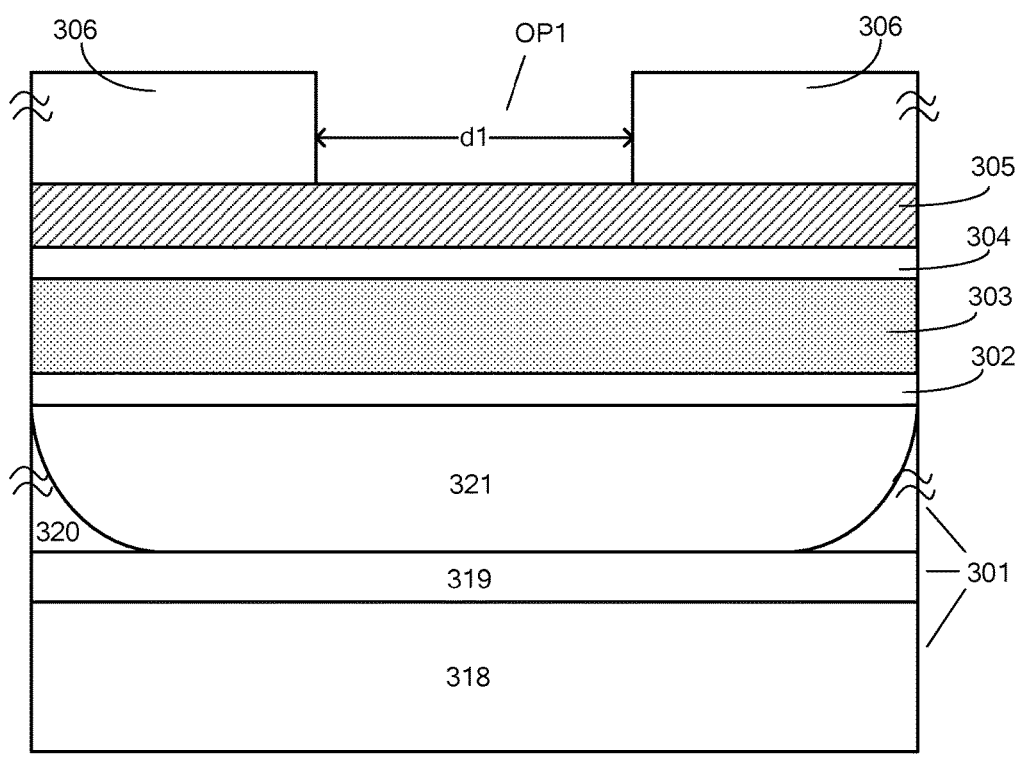
FIGS. 3a-i illustrate a process of fabricating the LDMOS device with small source in accordance with an embodiment of the present invention.

In FIG. 3a, a semiconductor substrate 301 is provided. The semiconductor substrate 301 comprises an original substrate 318, an N type Buried Layer (NBL) 319, an epitaxial layer 320 and a well region 321. The well region 321 is also referred as the drain drift region. The original substrate 318 may be N type, P type or intrinsic semiconductor material. The NBL 319 may be replaced with other structures. The epitaxial layer 320 may be N type, P type or intrinsic semiconductor material. The well region 321 may be a high voltage well with light doping concentration. The LDMOS device will be formed in the well region 321. The semiconductor substrate 301 may have other circuit(s)/device(s)/system(s) integrated in it. For example, in a BCD process, several devices, e.g., BJT (Bipolar Junction Transistor), CMOS (Complemented MOS devices), and so on would be integrated with LDMOS in a same substrate. In some embodiments, the semiconductor substrate may have other configuration or without some of the above regions. In FIG. 3a, a gate oxidation layer 302 is formed on a top surface of the semiconductor substrate 301. Next, on a top surface of the gate oxidation layer 302, polysilicon deposition is performed to form a polysilicon layer 303 which is later patterned as a gate of the LDMOS by etching via a photoresist layer. Then, an oxidation process or oxide deposition process is performed on a top surface of the polysilicon layer 303 to form a part of a gate seal layer 304. After that, a silicon nitride layer 305 is deposited on top of the gate seal layer 304. Next, a photoresist layer 306 atop the silicon nitride layer 305 is formed by performing a lithographic process. The photoresist layer 306 comprises at least a window OP1 through to a surface of the silicon nitride layer 305. The window OP1 is also referred as a source/body window and may be formed by dissolved the photoresist layer 306 in a defined position after exposure. In one embodiment, a width d1 of the window OP1 may be in a range of 0.3 μm-0.5 μm. In some embodiments, the photoresist layer 306 may be replaced by other material.

The gate oxidation layer 302 is adopted as a dielectric layer and the polysilicon layer 303 is adopted as an electric conducting layer of the gate of the LDMOS device. Persons of ordinary skill in the art should know that the gate oxidation layer 302 and the polysilicon layer 303 may be replaced by other proper material.

In FIGS. 3b-i, the original substrate 318, the NBL 319 and the epitaxial layer 320 are not shown for clarity.

Figure 3B:
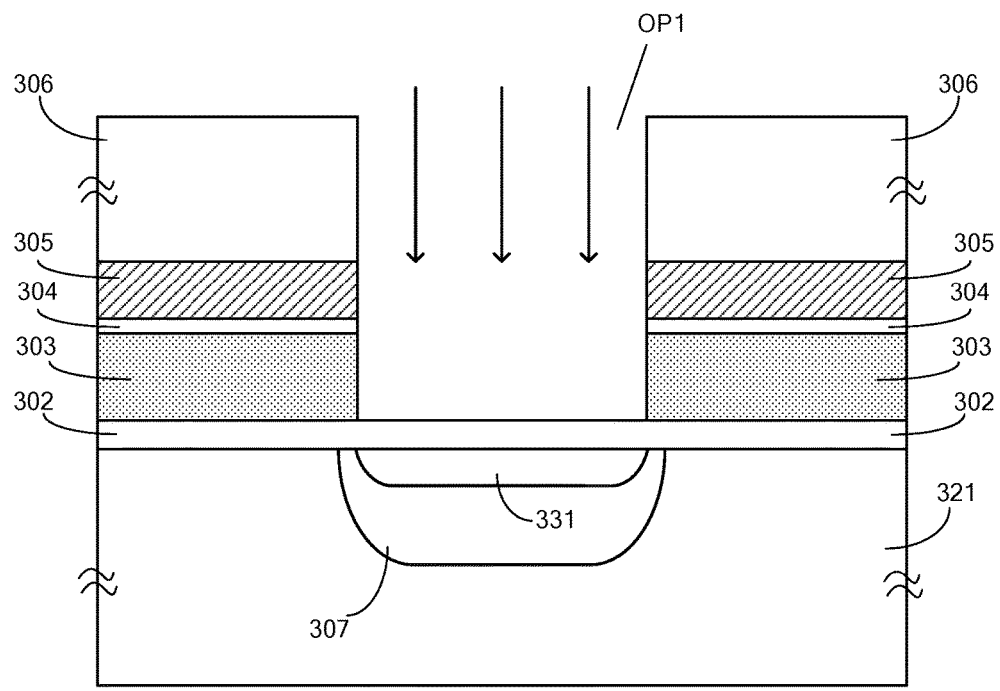

In FIG. 3b, the silicon nitride layer 305, the gate seal layer 304 and the polysilicon layer 303 are etched through the window OP1 to expose a surface of the well region 321 covered with gate oxidation layer 302 for a source/body region. After that, a body region 307 is formed by implanting P type dopants into the well region 321 under the window OP1. Next, a source layer 331 is formed by implanting N type dopants into the body region 307. The masking layer 306 is removed after forming the body region 307 and the source layer 331.

In one embodiment, the masking layer 306 is removed after forming the body region 307. In that case, the polysilicon layer 303, the gate seal layer 304 and the silicon nitride layer 305 are adopted as a masking layer for implanting N type dopants into the body region 307 to form the source layer 331.

In one embodiment, an anneal process may be performed after forming the body region 307. In other embodiments, the anneal process may be performed after forming both the body region 307 and the source layer 331.

Figure 3C:
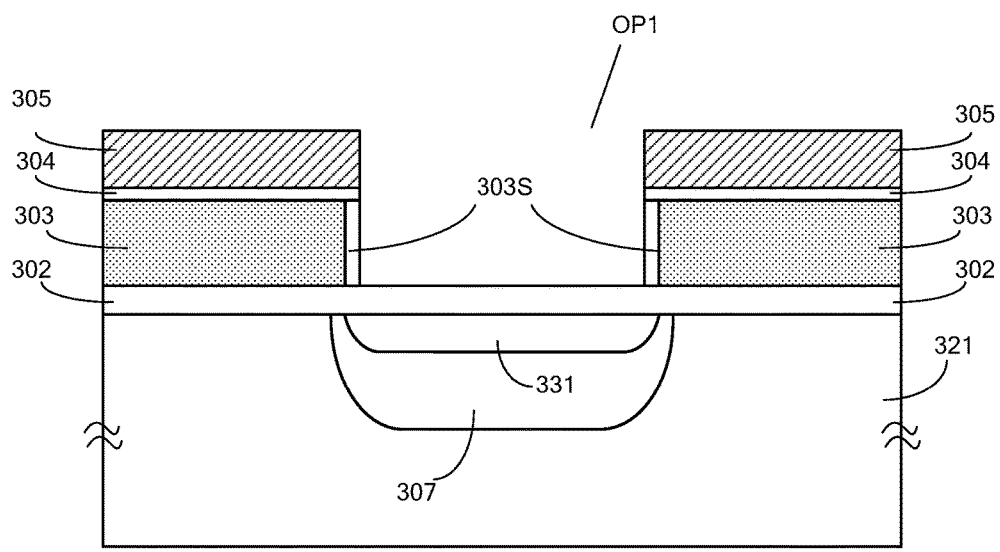

In FIG. 3c, an oxidation process is performed to form a silicon oxidation layer 303S to wrap the exposed side walls of the polysilicon layer 303 inside the window OP1. The silicon oxidation layer 303S constitutes part of the gate seal layer 304.

Figure 3D:
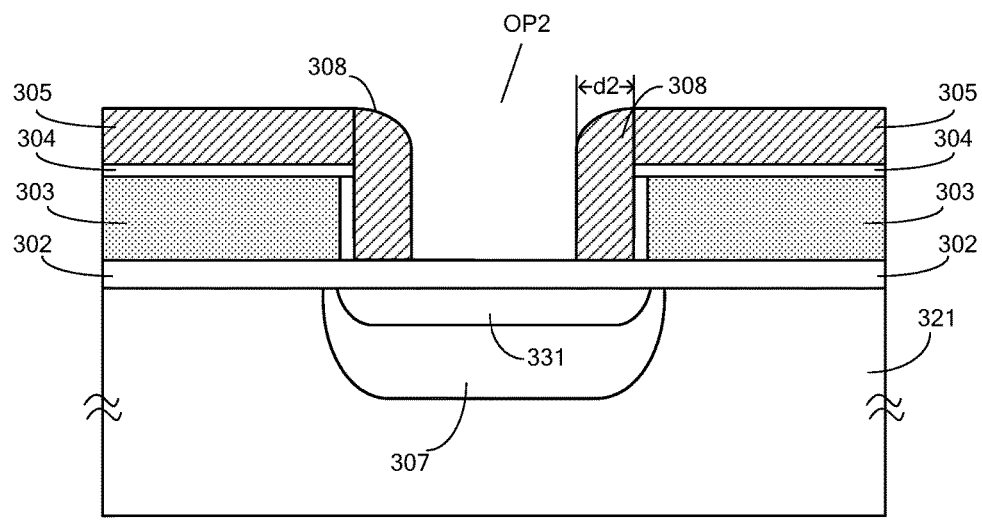

In FIG. 3d, silicon nitride (SiN) spacers 308 are formed to wrap the side gate seals 303S at the side walls of the polysilicon layer 303. The spacers 308 define positions of source regions inside the body region 307. Furthermore, the spacers 308 shape a window OP2 for the body pickup region 332 in the body region 307, wherein the window OP2 is also referred as a body pickup region window.

In one embodiment, the thickness d2 of each spacer 308 is in a range of 0.1 μm~0.15 μm.

Figure 3E:
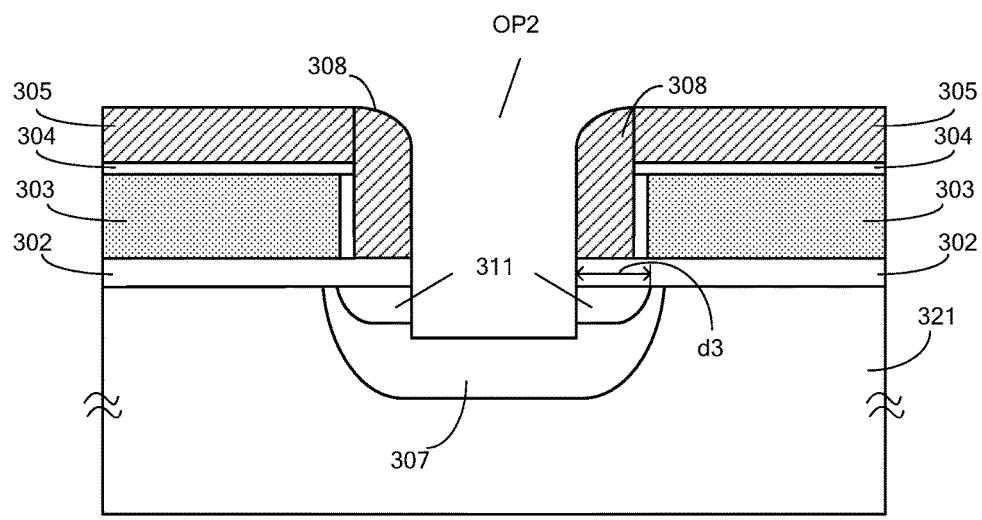

In FIG. 3e, the source layer 331 is etched through under the window OP2 to form source regions 311. The source regions 311 are parts of the source layer 331 and are protected by the spacers 308 during the etching process. Because the thickness of each spacer 308 is in a range of 0.1 μm~0.15 μm, a width d3 of the source region 311 is also in a range of 0.1 μm~0.15 μm. The side wall gate seal 303S is a very thin layer that could be ignored in a real device. The etching process is controlled to etch through the source layer 331. But in real application, it's hard to control the etching process to precisely etch the source layer 331 without harming the body region 307 under the etching area. So the body region 307 is preferred to have a junction depth which is enough for forming a body pickup region under the etching area afterwards.

Figure 3F:
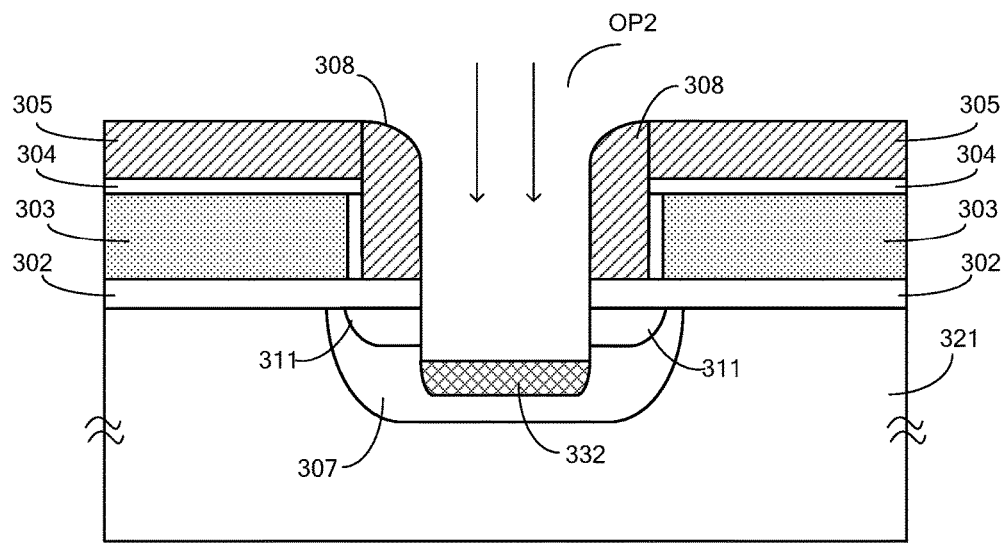

In FIG. 3f, P type dopants are implanted into the body region 307 through the window OP2 to form the body pickup region 332. The silicon nitride layer 305 and the spacer 308 are adopted as a masking layer for P type dopants implanted into the body region 307. The body pickup region 332 has a higher doping concentration than the body region 307.

In the embodiment of FIG. 3f, because the silicon nitride layer 305 and the spacer 308 are adopted as a masking layer, an additional masking layer, e.g., a photoresist layer, for the body pickup region 332 is saved. The silicon nitride layer 305 is also referred as a block layer. In some embodiments, other material with faster etching rate than the gate oxidation layer 302 instead of silicon nitride may be adopted to form the block layer 305.

Figure 3G:
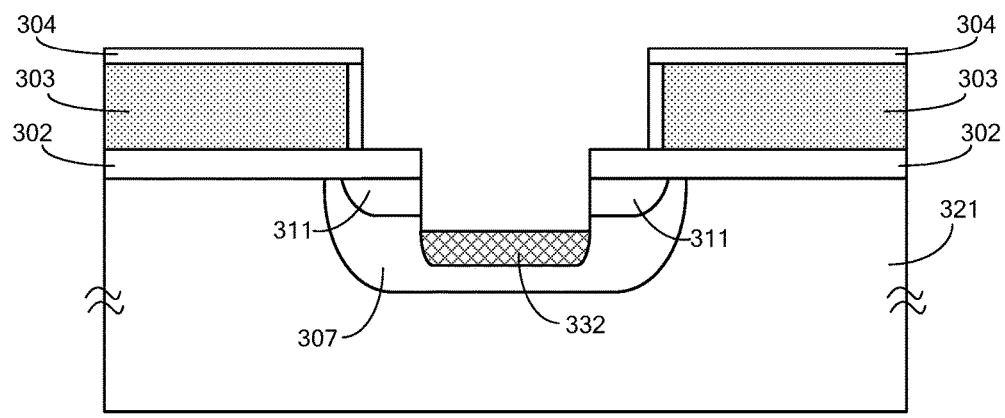

In FIG. 3g, the spacer 308 and the silicon nitride layer 305 are etched away.

Figure 3H:
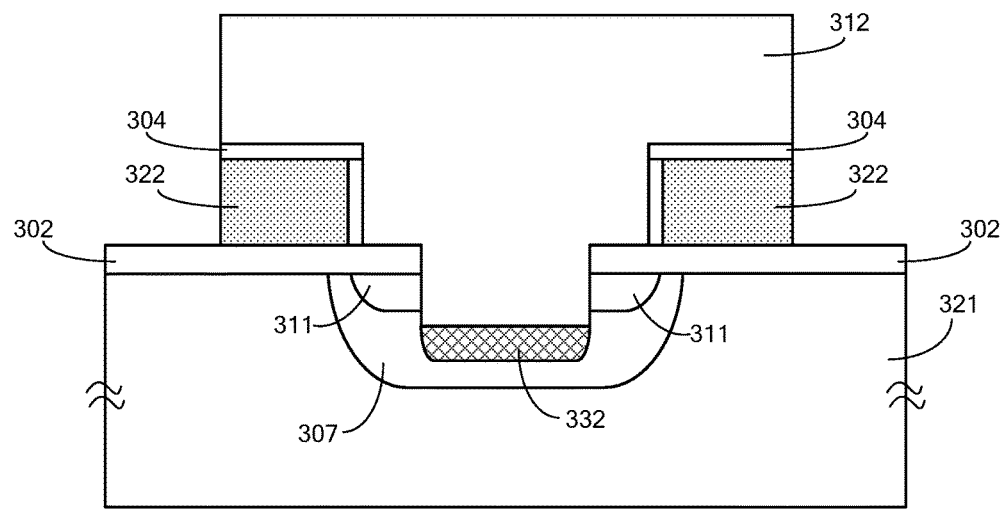

In FIG. 3h, a masking layer 312 is formed by performing the lithographic process. The masking layer 312 comprises positioned windows to pattern the gate. The polysilicon layer 303 is then etched to form a gate 322. The masking layer 312 is striped after forming the gate 322. The masking layer 312 is striped after forming the gate 322. An oxidation process may be performed to complete the gate seal layer 304.

Figure 3I:
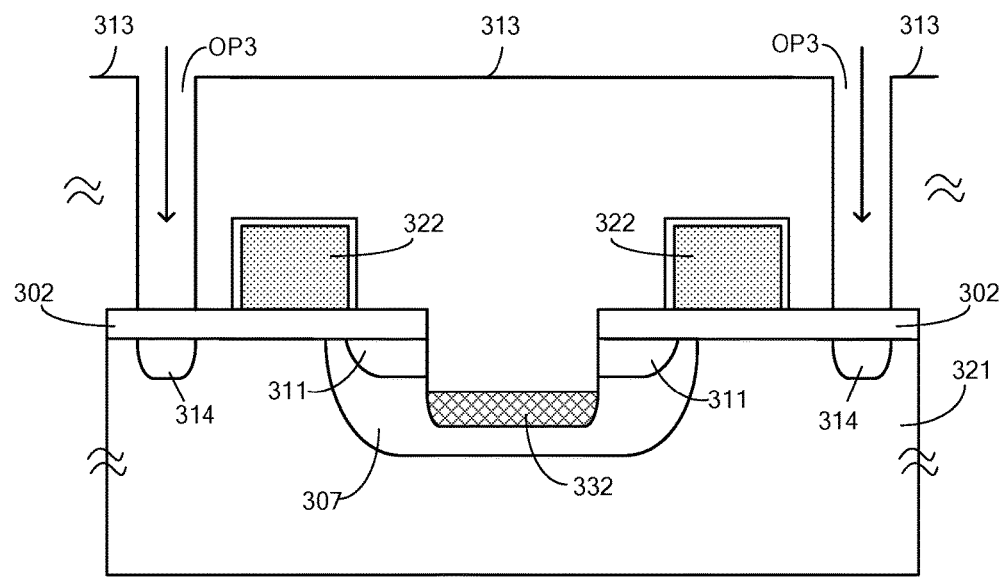

In FIG. 3i, a masking layer 313 is formed by performing the lithographic process. The masking layer 313 comprises positioned windows OP3 to define drain pickup regions 314 of LDMOS device. The masking layer 313 is formed also for NMOS's N+ source and drain region, and other N+ layers like NPN bipolar transistor's emitter region and collector region. The drain pickup regions 314 are then formed by implanting N type dopants into the well region 321 through the window OP3. The masking layer 313 is striped after forming the drain pickup region 314.

Figure 4:
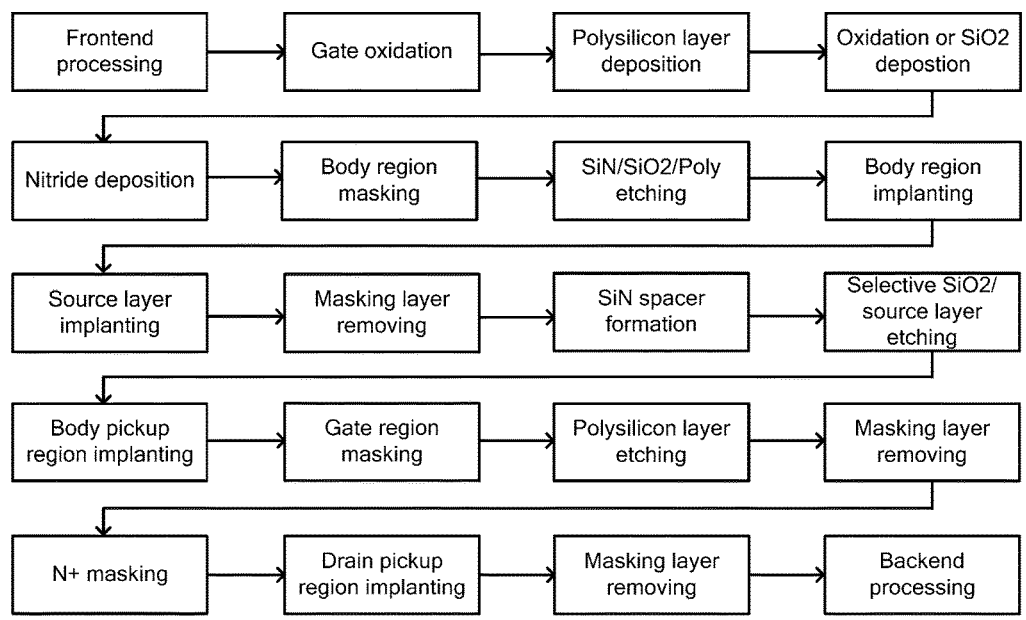
FIG. 4 shows a process flowchart outlining a manufacturing process that could be used to fabricate the LDMOS device of FIGS. 3a-i in accordance with an embodiment of the present invention.

FIG. 4 shows a process flowchart outlining a manufacturing process that could be used to fabricate the devices of FIGS. 3a-i in accordance with an embodiment of the present invention. Compared to prior art process shown in FIG. 2, spacers are formed at the side walls of the polysilicon layer in the window for the source/body region, to define positions of source regions in the well region. The thickness d2 of the spacer could be controlled in a range of 0.1 μm~0.15 μm, so that the width of d3 the source region could be controlled in the range of 0.1 μm~0.15 μm, which is much narrower than the source region width of the prior art process made LDMOS device. The present invention adopts spacers and CMP technologies to define the very narrow N+/P+/N+ source/body region which cannot be achieved by conventional photo/masking equipment.

It should be known that the doping type for each region may be in an alternating type, for example, the N type regions may be replaced with P type regions while the P type regions may be replaced with N type regions. In one embodiment as claimed in the appended claims, the first doping type may be N type and the second doping type may be P type. And in another embodiment, the first doping type is P type and the second doping type is N type.

The N type substance can be selected from one of the following: nitrogen, phosphorus, arsenic, antimony, bismuth and the combination thereof, while the P type substance can be selected from one of the following: boron, aluminum, gallium, indium, thallium and the combination thereof.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A manufacturing process of a LDMOS device in a well region of a first doping type in a semiconductor substrate, comprising:

forming a gate oxidation layer above the well region;

forming a polysilicon layer above the gate oxidation layer;

forming a layer of material having faster etching rate than the gate oxidation layer above the polysilicon layer;

etching both of the layer of material having faster etching rate than the gate oxidation layer and the polysilicon layer through a window of a first masking layer;

implanting dopants of a second doping type into the well region under the window of the first masking layer to form a body region;

implanting dopants of the first doping type into the body region under the window of the first masking layer to form a source layer;

forming spacers to wrap side walls of the polysilicon layer;

etching through the source layer under a window shaped by the spacers to form a source region;

implanting dopants of the second doping type into the body region through the window shaped by the spacers to form a body pickup region;

etching away both the spacers and the layer of material having faster etching rate than the gate oxidation layer;

etching the polysilicon layer through windows of a second masking layer to form a gate; and implanting dopants of the first doping type into the well region under a window of a third masking layer to form a drain pickup region.

2. The manufacturing process of claim 1, wherein the spacer has a same etching rate with the layer of material having faster etching rate than the gate oxidation layer.

3. The manufacturing process of claim 1, wherein the spacer and the layer of material having faster etching rate than the gate oxidation layer are made of silicon nitride.

4. The manufacturing process of claim 1, further comprising forming a gate seal layer between the polysilicon layer and the layer of material having faster etching rate than the gate oxidation layer.

5. The manufacturing process of claim 1, wherein the side wall of the polysilicon layer is oxidized before forming the spacer.

6. The manufacturing process of claim 1, wherein the thickness of each spacer at the side wall of the polysilicon layer is in a range of 0.1 μm~0.15 μm.

7. The manufacturing process of claim 1, wherein the width of the body region is in a range of 0.3 μm~0.5 μm.

8. A method for fabricating a LDMOS device in a well region of the semiconductor substrate, comprising:

forming a body region and a source layer in the well region through a window of a polysilicon layer above the well region, wherein the body region has a deeper junction depth than the source layer;

forming spacers at side walls of the polysilicon layer;

etching through the source layer through a window shaped by the spacers, wherein a region of the source layer under the spacers is protected from etching, and is defined as a source region of the LDMOS device;

forming a body pickup region under an etched region between the source regions; and removing the spacers after forming the body pickup region.

9. The method of claim 8, wherein the spacer is made of silicon nitride.

10. The method of claim 8, wherein the thickness of each spacer at the side walls of the polysilicon layer is in a range of 0.1 μm~0.15 μm.

11. The method of claim 8, wherein the width of the window for the body region is in a range of 0.3 μm~0.5 μm.

12. A manufacturing process of a LDMOS device, comprising:

forming a well region in a semiconductor substrate;

forming a gate oxidation layer above the well region;

depositing a polysilicon layer above the gate oxidation layer;

sequentially forming a gate seal layer, a silicon nitride layer and a first masking layer above the polysilicon layer, wherein the first masking layer comprises at least one window to the surface of the silicon nitride layer;

etching the silicon nitride layer, the gate seal layer and the polysilicon layer under the window of the first masking layer to expose a window for a body region in the well region;

implanting P type dopants into the well region through the window for the body region to form the body region in the well region;

implanting N type dopants into the body region through the window for the body region to form a source layer, and removing the first masking layer afterwards;

oxidizing side walls of the polysilicon layer;

forming spacers at the oxidized side walls of the polysilicon layer;

etching through the source layer through a window shaped by the spacers to form a source regions under the spacer;

implanting P type dopants into a etched region between the source regions to form a body pickup region;

etching away the silicon nitride layer and the spacers;

forming a second masking layer above the gate seal layer, wherein the second masking layer has windows at predetermined positions;

etching the gate seal layer and the polysilicon layer through the windows of the second masking layer to form a gate, and removing the second masking layer afterwards;

forming a third masking layer above the gate seal layer and the gate oxidation layer, wherein the third masking layer comprise at least one window for a drain pickup region; and implanting N type dopants into the well region under the at least one window of the third masking layer to form the drain pickup region, and removing the third masking layer afterwards.

13. The manufacturing process of claim 12, wherein the spacers are made of silicon nitride.

14. The manufacturing process of claim 12, wherein the thickness of each spacer at the side wall of the polysilicon layer is in a range of 0.1 μm~0.15 μm.

15. The manufacturing process of claim 12, wherein the width of the body region is in a range of 0.3 μm~0.5 μm.

* * * * *